US006797189B2

United States Patent
Hung et al.

(10) Patent No.: US 6,797,189 B2
(45) Date of Patent: *Sep. 28, 2004

(54) ENHANCEMENT OF SILICON OXIDE ETCH RATE AND NITRIDE SELECTIVITY USING HEXAFLUOROBUTADIENE OR OTHER HEAVY PERFLUOROCARBON

(76) Inventors: Hoiman (Raymond) Hung, 1282 Burkette Dr., San Jose, CA (US) 95129; Joseph P. Caulfield, 5866 St. Paul Ct., Oakland, CA (US) 94618; Hongqing Shan, 3630 Tumble Way, San Jose, CA (US) 95132; Michael Rice, 785 Claret Ct., Pleasanton, CA (US) 94566; Kenneth S Collins, 165 Knightshaven Way, San Jose, CA (US) 95111; Chunshi Cui, 1750 Halford, Santa Clara, CA (US) 95051

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 78 days.

This patent is subject to a terminal disclaimer.

(21) Appl. No.: 09/276,376

(22) Filed: Mar. 25, 1999

(65) Prior Publication Data

US 2002/0175144 A1 Nov. 28, 2002

(51) Int. Cl.⁷ .......................................... H01L 21/3065
(52) U.S. Cl. .............................. 216/67; 216/72; 216/79; 438/723; 438/738; 438/743
(58) Field of Search ................... 216/67, 72, 79, 216/80; 438/723, 738, 743

(56) References Cited

U.S. PATENT DOCUMENTS

| | | | |
|---|---|---|---|
| 5,173,151 A | 12/1992 | Namose | 156/643 |
| 5,328,558 A | 7/1994 | Kawamura | 156/643 |
| 5,366,590 A | 11/1994 | Kadomura | 156/662 |
| 5,384,009 A | 1/1995 | Mak et al. | 156/662 |
| 5,474,615 A | 12/1995 | Ishida et al. | 134/1.2 |
| 5,744,049 A | 4/1998 | Hills et al. | 216/67 |

(List continued on next page.)

FOREIGN PATENT DOCUMENTS

| | | | | |
|---|---|---|---|---|
| EP | 0 840 365 | 5/1998 | | |
| JP | 6-275568 | 9/1994 | | |
| JP | 8-31802 | 2/1996 | | |
| JP | 8-165584 | 6/1996 | | |
| JP | 9-312350 | 2/1997 | | |
| JP | 9-191002 | * 7/1997 | ....... | H01L/21/3065 |
| JP | 10189537 | 9/1998 | | |
| JP | 10-313009 | 11/1998 | | |

Primary Examiner—Allan Olsen
(74) Attorney, Agent, or Firm—Charles S. Guenzer; Joseph Bach

(57) ABSTRACT

A plasma etching process, particularly useful for selectively etching oxide over a feature having a non-oxide composition, such as silicon nitride and especially when that feature has a corner that is prone to faceting during the oxide etch. A primary fluorine-containing gas, preferably hexafluorobutadiene ($C_4F_6$), is combined with a significantly larger amount of the diluent gas xenon (Xe) enhance nitride selectivity without the occurrence of etch stop. The chemistry is also useful for etching oxides in which holes and corners have already been formed, for which the use of xenon also reduces faceting of the oxide. For this use, the relative amount of xenon need not be so high. The invention may be used with related heavy fluorocarbons and other fluorine-based etching gases.

29 Claims, 5 Drawing Sheets

U.S. PATENT DOCUMENTS

| | | | |
|---|---|---|---|
| 5,770,098 A | * | 6/1998 | Araki et al. .................. 216/67 |
| 5,779,926 A | | 7/1998 | Ma et al. ...................... 216/67 |
| 5,811,357 A | | 9/1998 | Armacost et al. ........... 438/723 |
| 6,028,362 A | | 2/2000 | Omura ....................... 257/774 |
| 6,037,213 A | * | 3/2000 | Shih et al. .................. 438/253 |
| 6,069,092 A | * | 5/2000 | Imai et al. .................. 438/723 |
| 6,074,959 A | * | 6/2000 | Wang et al. ................. 438/738 |
| 6,117,786 A | | 9/2000 | Khajehnouri et al. ....... 438/700 |
| 6,174,451 B1 | * | 1/2001 | Hung et al. ................... 216/67 |
| 6,211,092 B1 | * | 4/2001 | Tang et al. ................. 438/719 |
| 6,297,163 B1 | | 10/2001 | Zhu et al. ................... 438/707 |
| 6,365,060 B1 | | 4/2002 | Nagaseki et al. .............. 216/59 |

* cited by examiner

ENHANCEMENT OF SILICON OXIDE ETCH RATE AND NITRIDE SELECTIVITY USING HEXAFLUOROBUTADIENE OR OTHER HEAVY PERFLUOROCARBON

RELATED APPLICATION

This application is related to Ser. No. 09/276,311 concurrently filed Mar. 23, 1999 by Hung et al.

FIELD OF THE INVENTION

The invention relates generally to etching of silicon integrated circuits. In particular, the invention relates to etching silicon oxide and related materials in a process that is capable of greatly reduced etching rates for silicon nitride and other non-oxide materials but still producing a vertical profile in the oxide.

BACKGROUND ART

In the fabrication of silicon integrated circuits, the continuing increase in the number of devices on a chip and the accompanying decrease in the minimum feature sizes have placed increasingly difficult demands upon many of the many fabrication steps used in their fabrication including depositing layers of different materials onto sometimes difficult topologies and etching further features within those layers.

Oxide etching has presented some of the most difficult challenges. Oxide is a somewhat generic term used for silica, particularly silicon dioxide ($SiO_2$) although slightly non-stoichiometric compositions $SiO_x$ are also included, as is well known. The term oxide also covers closely related materials, such as oxide glasses including borophosphosilicate glass (BPSG). Some forms of silicon oxynitride are considered to more closely resemble an oxide than a nitride. Small fractions of dopants such as fluorine or carbon may be added to the silica to reduce its dielectric constant. Oxide materials are principally used for electrically insulating layers, often between different levels of the integrated circuit. Because of the limits set by dielectric breakdown, the thickness of the oxide layers cannot be reduced to much below 0.5 to 1 $\mu$m. However, the minimum feature sizes of contact and via holes penetrating the oxide layer are being pushed to well below 0.5 $\mu$m, the current developmental goal being 0.18 $\mu$m. The result is that the holes etched in the oxide must be highly anisotropic and must have high aspect ratios, defined as the depth to the minimum width of a hole. A further problem arises from the fact that the underlying silicon may be formed with active doped regions of thicknesses substantially less than the depth of the etched hole (the oxide thickness). Due to manufacturing variables, it has become impossible to precisely time a non-selective oxide etch to completely etch through the silicon oxide without a substantial probability of also etching through the underlying active silicon region.

The anisotropy can be achieved by dry plasma etching in which an etching gas, usually a fluorine-based gas, is electrically excited into a plasma. The plasma conditions may be adjusted to produce highly anisotropic etching in many materials. However, the anisotropy should not be achieved by operating the plasma reactor in a purely sputtering mode in which the plasma ejects particles toward the wafer with sufficiently high energy that they sputter the oxide. Sputtering is generally non-selective, and high-energy sputtering also seriously degrades semiconducting silicon exposed at the bottom of the etched contact hole.

In view of these and other problems, selective etching processes have been developed which depend more upon chemical effects. These processes are often described as reactive ion etching (RIE). The most popular active etching gas is a fluorocarbon (including hydrofluorocarbons) although some effort is being expended with other fluorinated gases such as $SF_6$. A sufficiently high degree of selectivity allows new structures to be fabricated without the need for precise lithography for each level.

An example of such an advanced structure is a self-aligned contact (SAC), illustrated in the cross-sectional view of FIG. 1. The illustrated SAC structure includes parts of two transistors formed on a silicon substrate 2. A polysilicon gate layer 4, a tungsten silicide barrier and glue layer 6, and a silicon nitride cap layer 8 are deposited and photolithographically formed into two closely spaced gate structures 10 having a gap 12 therebetween. Chemical vapor deposition is then used to deposit onto the wafer a substantially conformal layer 14 of silicon nitride ($Si_3N_4$), which coats the top and sides of the gate structures 10 as well as a bottom 15 of the gap 12. In practice, the nitride deviates from the indicated stoichiometry and may have a composition of $SiN_x$, where x is between 1 and 1.5; the nitride acts as an electrical insulator. Dopant ions are ion implanted using the gate structures 10 as a mask to form a self-aligned p-type or n-type well 16, which acts as a common source for the two transistors having respective gates 10. The drain structures of the two transistors are not illustrated.

An oxide field layer 18 is deposited over this previously defined structure, and a photoresist layer 20 is deposited over the oxide layer 18 and photographically defined into a mask. A subsequent oxide etching step etches a contact hole 22 through the oxide layer 18 and stops on a portion 24 of the nitride layer 14 underlying the hole 22. It is called a contact hole because the metal subsequently deposited into the contact hole 22 contacts underlying silicon rather than a metallic interconnect layer; the latter structure is called a via hole and is included within some aspects of the present invention. A soft post-etch plasma treatment removes the nitride portion 24 at the bottom 15 of the gap 12. The silicon nitride acts as an electrical insulator between the gate structure 10 and the metal, usually aluminum, thereafter filled into the contact hole 22.

Because the nitride acts as an insulator, the SAC structure and process offer the advantage that the contact hole 22 may be wider than the width of the gap 12 between the gate structures 10. In advanced devices, the gap 12 between the gate structures 10 may be very small, less than 10 nm, while the width of the contact hole 22 may be significantly larger. Additionally, the photolithographic registry of the contact hole 22 with the gate structures 10 need not be precise. The imprecise definition of the mask in the photoresist layer 20 may place one side of the contact hole 22 near the middle of the gap 12, as illustrated in FIG. 2, with a narrow side gap 26 forming at the bottom of the contact hole 22 on the side of one of the gate structures. The width of the side gap 26 may be 0.1 $\mu$m or less. Nonetheless, this may still provide a good contact. However, to achieve these beneficial effects, the SAC oxide etch must be highly selective to nitride. That is, the process must produce an oxide etch rate that is much greater than the nitride etch rate. Numerical values of selectivity are calculated as the ratio of the oxide to nitride etch rates. Selectivity is especially critical at corners 28 of the nitride layer 14 above and next to the gap 12 or 26 since the nitride corners 28 are the portion of the nitride exposed the longest to the oxide etch. Furthermore, they have a geometry favorable to fast etching that tends to create facets at the nitride corners 28. The corners of the gate structures 10 will thereby be prematurely exposed if the faceting is severe enough.

Furthermore, increased selectivity is being required with the increased usage of chemical mechanical polishing (CMP) for planarization of an oxide layer over a curly wafer. The polishing planarization produces a flat top surface in the oxide layer over the wavy underlying substrate, thereby producing an oxide layer of significantly varying thickness. To compensate for this variable thickness, the time of the oxide etch must be set significantly higher, say by 100%, than the etching time for the design thickness to assure penetration of the variable thickness oxide. This extra etching time is called over etch, which also accommodates other process variations. However, for the regions with a thinner oxide, the nitride is exposed that much longer to the etching environment.

Ultimately, the required degree of selectivity is reflected in the probability of an electrical short through the nitride layer 14 between the gate structures 10 and the metal filled into the contact hole 22. The etch must also be selective to photoresist, for example at facets 29 that develop at corners of the mask 20, but the requirement of photoresist selectivity is not so stringent since the photoresist layer 20 may be made much thicker than the nitride layer 14.

In the future, the most demanding etching steps are projected to be performed with high-density plasma (HDP) etch reactors. Such HDP etch reactors achieve a high-density plasma having a minimum average ion density of $10^{11} cm^{-3}$ across the plasma exclusive of the plasma sheath. Although several techniques are available for achieving a high-density plasma such as electron cyclotron resonance and remote plasma sources, the commercially most important technique involves inductively coupling RF energy into the source region. The inductive coil may be cylindrically wrapped around the sides of chamber or be a flat coil above the top of the chamber or represent some intermediate or combination geometry.

An example of an inductively coupled plasma etch reactor is the Inductive Plasma Source (IPS) etch reactor, which is available from Applied Materials and which Collins et al. describe in U.S. patent application, Ser. No. 08/733,544, filed Oct. 21, 1996 and in European Patent Publication EP-840,365-A2. As shown in FIG. 3, a wafer 30 to be processed is closely supported on a cathode pedestal 32 supplied with RF power from a first RF power supply 34 to create a DC bias. A silicon ring 36 surrounds the pedestal 32 and is controllably heated by an array of heater lamps 38. A grounded silicon wall 40 surrounds the plasma processing area. A silicon roof 42 overlies the plasma processing area, and lamps 44 and water cooling channels 46 control its temperature. In the described embodiments, the silicon roof 42 is grounded, but it may be separately RF biased for other applications. The volume of the vacuum processing chamber is about 23 liters. The temperature-controlled silicon ring 36 and silicon roof 42 may be used to scavenge fluorine from the fluorocarbon plasma. For some applications, fluorine scavenging can be accomplished by a solid carbon body, such as amorphous or graphitic carbon, or by other non-oxide silicon-based or carbon-based materials, such as silicon carbide.

Processing gas is supplied from one or more bottom gas feeds 48 through a bank of mass flow controllers 50 under the control of a system controller 52, in which is stored the process recipe in magnetic or semiconductor memory. Gas is supplied from respective gas sources 54, 56. The conventional oxide etch recipe uses a combination of a fluorocarbon or hydrofluorocarbon and argon. Octafluorocyclobutane ($C_4F_8$) and trifluoromethane ($CHF_3$) are popular fluorocarbons, but other hydrogen-free fluorocarbons, hydrofluorocarbons, and combinations thereof are used, and these other etching gases are the subject of at least part of this invention.

A metal manifold wall 58 connected mechanically and electrically to the silicon chamber wall 40 defines a pumping channel 59 surrounding the lower portion the main processing area and connected to it by an annular constricted orifice 60. An unillustrated robot blade transfers the wafer 30 into and out of the chamber through an unillustrated slit valve associated with an opening 61 in the manifold wall 58. An unillustrated vacuum pumping system connected to the a pumping channel 59 maintains the chamber at a preselected pressure, as set by the controller 52.

The controller 52 controls the various reactor element according to the etch recipe and thus determines the etch process.

In the used configuration, the silicon roof 42 is grounded, but its semiconductor resistivity and thickness are chosen to pass generally axial RF magnetic fields produced by an inner inductive coil stack 62 and an outer inductive coil stack 64 powered by respective RF power supplies 66, 68. A single RF power supply and an RF power splitter may be substituted. In the IPS reactor used in the experiments to be the described, the frequencies of the three RF power supplies were different and all in the low megahertz range.

Optical emission spectroscopy (OES) is a conventional monitoring process used for end-point detection in plasma etching. An optical fiber 70 is placed in a hole 72 penetrating the chamber wall 40 to laterally view the plasma area 74 above the wafer 30. An optical detector system 76 is connected to the other end of the fiber 70 and includes one or more optical filters and processing circuitry that are tuned to the plasma emission spectrum associated with the aluminum, copper, or other species in the plasma. Either the raw detected signals or a trigger signal is electronically supplied to the controller 52, which can use the signals to determine that one step of the etch process has been completed when either a new signal appears or an old one decreases. With this determination, the controller 52 can adjust the process recipe or end the etching step according to the power levels set primarily in the source power supplies 66, 68.

The IPS chamber can be operated to produce a high-density or a low-density plasma. The temperature of the silicon surfaces and of the wafer can be controlled. The bias power applied to the cathode 72 by the bias power supply 34 can be adjusted independently of the source power 66, 68 applied to the coils 62, 64 and can be made small enough or even zero for a soft plasma etch process.

It has become recognized, particularly in the use of HDP etch reactors, that selectivity in an oxide etch can be achieved by a fluorocarbon etching gas forming a polymer layer upon the non-oxide portions, thereby protecting them from etching, while the oxide portions remain exposed to the etching environment because the oxygen included in the oxide combines the the carbon included in any incipiently forming polymer to form volatile $CO_2$. Polymer forming on the oxide sidewalls also promote vertical etching profiles. It is believed that the temperature controlled silicon ring 36 and roof 42 in the reactor of FIG. 3 control the fluorine content of the polymer, and hence its effectiveness against etching by the fluorocarbon plasma, when the polymer overlies a non-oxide. However, the polymerization mechanism is responsible for a major problem in oxide etching if high selectivity is being sought. If excessive amounts of polymer are deposited on the oxide or nitride surfaces in the contact hole being etched, the hole can close up and the etching is stopped prior to complete etching to the bottom of the hole. This deleterious condition is referred to as etch stop.

The selectivity is partly achieved in many recipes by the use of a chemically inactive diluent gas, most typically argon (Ar). The argon is at least partially ionized in the plasma so that it is accelerated across the plasma sheath adjacent to the wafer 30. The energetic argon promotes the chemically based etching of silica and other oxide layers in a process often referred to as reactive ion etching (RIE). The directionality of the argon ions also promotes the formation of the protective polymer on the sidewalls while acting to prevent its formation on the hole bottom.

As mentioned, argon is the most popular diluent gas. Many references for oxide etching based on fluorine chemistry mention other noble gases including helium, neon, xenon, and krypton (He, Ne, Xe, Kr) as alternatives to argon, but no advantage is ascribed to any of them. See, for example, U.S. Pat. No. 5,173,151 to Namose and U.S. Pat. No. 5,811,357 to Armacost et al. On the other hand, in some types of metal etching based on chlorine chemistry, xenon is preferred. See, for example, U.S. Pat. No. 5,384,009 to Mak et al. Similarly, in some types of silicon etching based on bromine, xenon or krypton is preferred. See, for example, U.S. Pat. No. 4,786,359 to Stark et al.

A further problem with polymerization in a fluorine-based etch is that the polymer formation may depend critically upon the processing conditions. It may be possible to achieve high selectivity with processing conditions produced by one set of processing parameters, but very small variations in those conditions may be enough to either substantially reduce the selectivity on one hand or to produce etch stop on the other. Either result is unacceptable in a commercial process. Such variations can occur in at least two ways. The conditions at the middle of the wafer may vary from those at the center. Furthermore, the conditions may change over time on the order of minutes as the chamber warms up or on the order of days as the equipment ages or as chamber parts are replaced. It is felt that hardware can be controlled to no better than ±5 or 6%, and a safety margin or 3 to 6 is desired. Mass flow controllers 46 are difficult to control to less than ±1 sccm (standard cubic centimeter per minute) of gas flow so gas flows of any constituent gas of only a few sccm are prone to large percentage variations.

These factors indicate that a commercially viable etch process must have a wide process window. That is, moderate variations in such parameters as gas composition and chamber pressure should produce only minimal changes in the resultant etching.

Although octafluorocyclobutane ($C_4F_8$) remains the most popular oxide etching gas for advanced oxide etching, we observe that it suffers from too narrow a process window. Furthermore, although $C_4F_8$ is known to provide selectivity at the bottom of the etching hole, it provides little sidewall passivation, which is required for the desired vertical profiles. Also, $C_4F_8$ has a boiling point of ±1° C., which is considered somewhat high for use as a gaseous etchant, especially in view of a trend to operate with very cold cathodes. Another heavy fluorocarbon that is used for oxide etching is $C_5F_8$, typically in the form of one of the isomers of octafluoropentadiene. Often carbon monoxide (CO) is added to $C_4F_8$ to increase the sidewall passivation as well as increase general nitride selectivity. However, CO is not only toxic, it also forms carbonyls with nickel and iron in gas cylinders and supply lines. The carbonyls are believed to contaminate wafers. For these reasons, the use of CO is not preferred.

Hung et al. in concurrently filed U.S. patent application, Ser. No. 09/276,311, disclose the advantageous use of the heavy fluorocarbon gas hexafluorobutadiene ($C_4F_6$) in combination with argon or possibly other noble gases for etching oxide in the IPS chamber of FIG. 2. This patent application is incorporated herein by reference in its entirety. Hexafluorobutadiene has the chemical structure illustrated in FIG. 4. The combination of $C_4F6$ and large amounts of Ar is shown to produce highly isotropic etching with acceptable selectivity to corner nitride in SAG and related applications. Importantly, the process is shown to exhibit a wide process window.

However, even better nitride selectivity is desired, and even wider process windows are desired. Furthermore, some applications involving a very deep oxide etch do not require such high nitride selectivity but require a high selectivity to photoresist. For example, etching a trench for forming sidewall capacitors for dynamic random access memory (DRAM) may require etching the fairly narrow trench through 1.5 µm or more of oxide while using only a photoresist mask. In this application, trench profile is less an issue than is photoresist selectivity.

Other applications require etching an oxide layer into which holes have already been formed. This geometry requires that the oxide corners not be unduly faceted.

SUMMARY OF THE INVENTION

The use of xenon (Xe) as the diluent gas in fluorine-based oxide etching provides very good nitride selectivity and a wide process window, especially in combination with hexafluorobutadiene ($C_4F_6$). For nitride selectivity, the amount of xenon should be substantially greater than that of the fluorocarbon. Krypton (Kr) promises similar effects.

The combination of Xe and $C_4F_6$ is also advantageous in avoiding faceting of oxide corners.

The use of Xe or Kr as a carrier gas for oxide etching can also be extended to other fluorine-containing etching, especially the heavier hydrogen-free fluorocarbons.

DETAILED DESCRIPTION OF THE PREFERRED EMBODIMENTS

Figure 5:
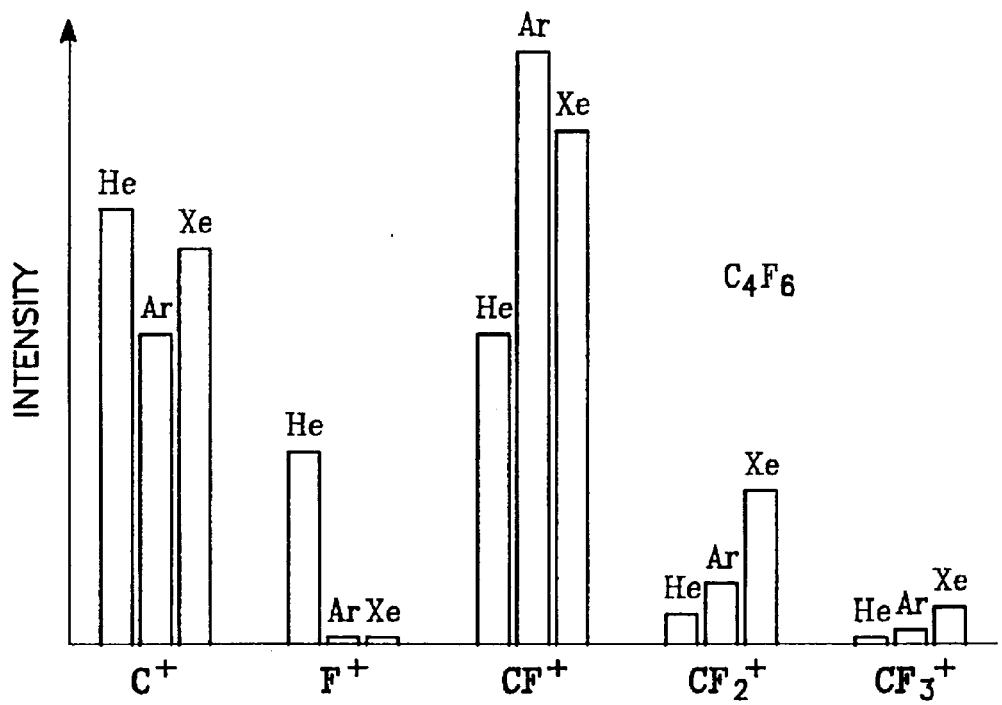
FIG. 5 is a chart of histograms showing the distribution of radicals produced in a plasma of $C_4F_6$ and different noble gases.

Xenon (Xe) demonstrates a substantially different behavior from argon (Ar) when used as a diluent gas in fluorine-based oxide etching. A series of preliminary experiments were performed in the IPS reactor in which a mass spectrometer was attached to the chamber while a mixture of $C_4F6$ and either helium (He), Ar, or Xe was admitted to the chamber and excited into a plasma under fairly realistic excitation power and pressure. The relative intensities for the ions $C^+$, $F^+$, $CF^+$, $CF_2^+$, and $CF_3^+$ are shown in FIG. 5 for the three diluents He, Ar, and Xe. No attempt was made to ionize neutral radicals. These data show a significantly different distribution for the ionic species dependent upon the noble gas. Helium is totally different except for the $C^+$ ion. Xenon relative to argon favors the formation of the heavier ion $CF_2^+$, which has been ascribed to be responsible for polymer formation. Somewhat similar results are obtained with $C_4F_8$ although this fluorocarbon produces only about half the amount of $C^+$ relative to the other ionic species.

Further experiments were performed to obtain parameters relevant to the plasma. These experiments were performed using a Langmuir probe inserted into the plasma of the IPS chamber with the plasma source power set to 1 kW.

Figure 6:
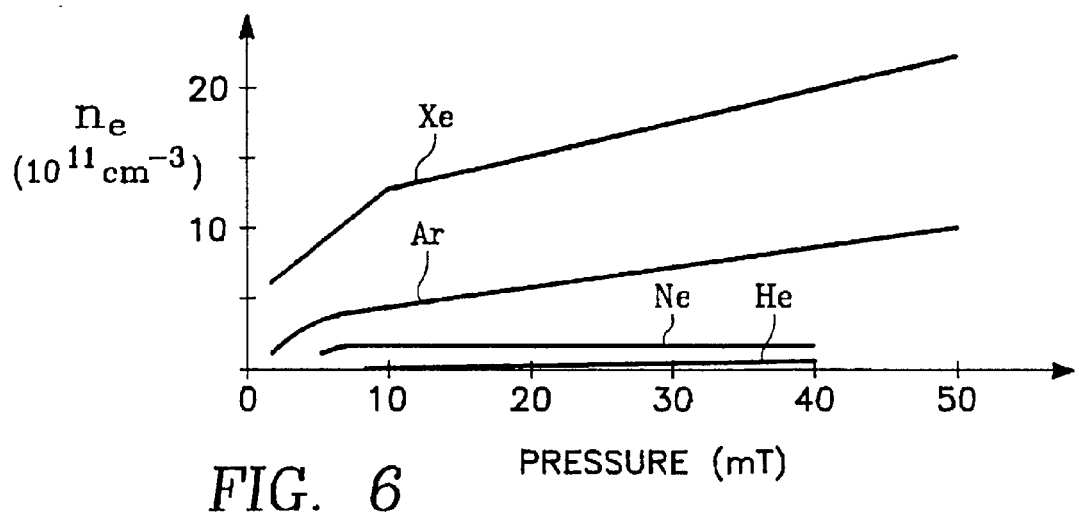
FIG. 6 is a graph of the electron density as a function of pressure in a plasma of different noble gases.

The electron densities $n_e$ for the four noble gases He, Ne, Ar, and Xe are plotted in the graph of FIG. 6 as a function of the pressure in the chamber. Krypton (Kr) is not included because it is considered to be too expensive for commercial use. Two points are observed. First, xenon produces a significantly higher electron density, which is not unexpected because the heavier noble gases have progressively lower ionization energies. Secondly, the slope of the electron densities as a function of pressure is smaller above 10 milliTorr, indicating that a wider process window can be found at the higher pressures. For plasmas of noble gases, the electron density equals the ion density, which is the density of interest in the etching plasma of the invention. However, when the plasma also includes fluorocarbons or other fluorine-containing gases, the equality breaks down because fluorine is the most electronegative atom and, in balancing positively charged ions with negatively charged particles, both electrons and negatively charged fluorine ions need to be considered.

Figure 7:
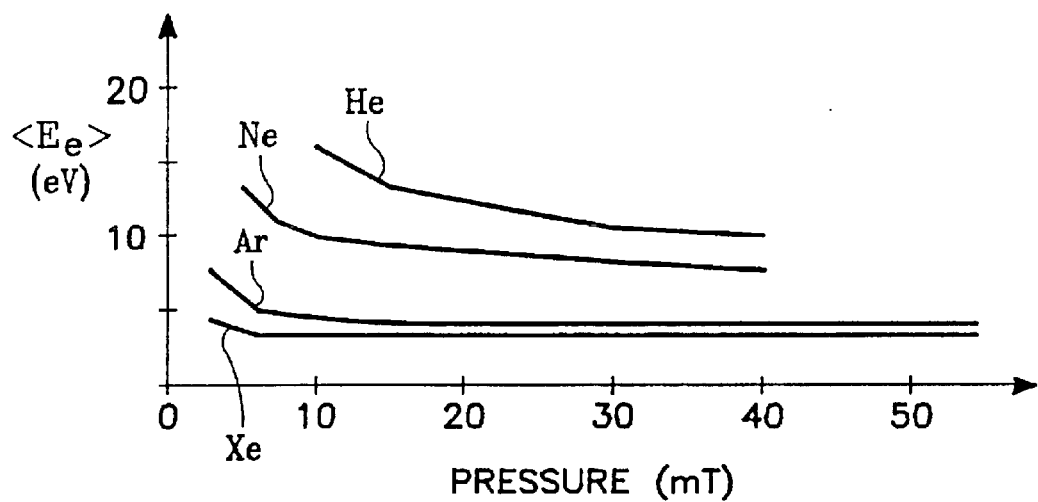
FIG. 7 is a graph of the average electronic density as a function of pressure in a plasma of different noble gases.

The average electron energies $<E_e>$ for the same noble gases are plotted in the graph of FIG. 7 as a function of chamber pressure. Three points are observed. First, a xenon plasma has the lowest average electron energy, though not substantially lower than an argon plasma. Secondly, all the gases show an inflection point at lower pressures. However, the inflection point for xenon is at the lowest pressure, about 5 milliTorr, and the electron energy is substantially flat above that pressure. This again indicates a wider process window for xenon existing at higher pressures of xenon above about 7 milliTorr. Thirdly, the higher electron density of xenon shown in FIG. 6 and the lower electron energy of xenon shown in FIG. 6 means that there are more low-energy electrons with xenon and more high-energy electrons with argon and the other noble gases. This last observation can be used to explain the distributions of radicals shown in FIG. 5 if the points taken above can be applied to the corresponding ion densities and energies. It can be assumed that it requires a higher ion energy to crack a $C_4F_6$ molecule into small fragments, such as $F^+$ and $CF^+$, than into larger fragments such as $CF_2^+$ and $CF_3^+$. Therefore, the higher density of low-energy xenon ions favors formation of larger fragments while the higher density of high-energy Ar, Ne, and He ions favors formation of small fragments.

Figure 8:
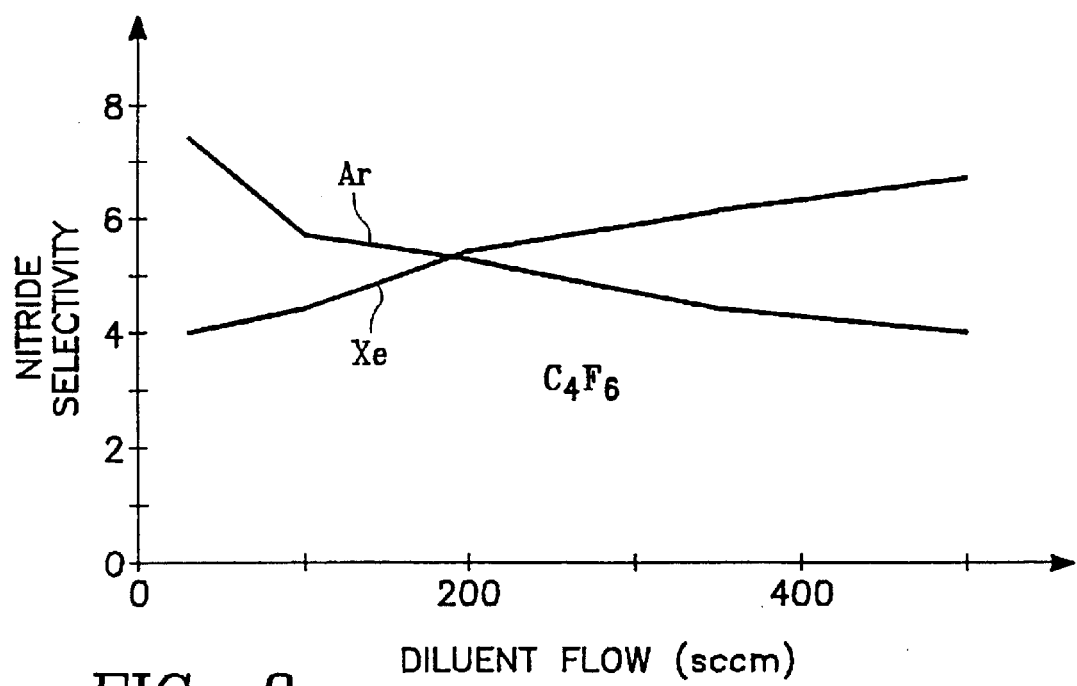
FIG. 8 is a graph illustrating selectivity to nitride in a plasma etch process using $C_4F_6$ and Xe.

Two series of experiments were performed which measured oxide and nitride etch rates for blanket structures, that is, unpatterned oxide and nitride layers. The experiments used a combination of $C_4F6$ and either Ar and Xe. The selectivity to nitride is plotted in FIG. 8 for the two diluent gases as a function of the diluent flows. The two diluents exhibit significantly different behavior. The nitride selectivity for Ar is highest at low Ar flows and decreases at higher argon flow. However, the cited $C_4F6$ patent to Hung et al. demonstrates that in narrow geometries such as SAC structures, a higher argon flow is required to prevent etch stop. On the other hand, the data of FIG. 8 shows that nitride selectivity for Xe rises with increasing Xe flow. As a result, no etch stop and high nitride selectivity can both be attained with high flows of Xe. The data of FIG. 8 are derived from separately measured oxide and nitride losses. The oxide losses (oxide etch rate) for the two diluents do not significantly differ, both decreasing about 30% from 20 sccm to 500 sccm of the diluents. However, the nitride loss with Ar remains substantially constant from 100 sccm to 500 sccm while that with Xe drops by almost a factor of three between 20 sccm and 500 sccm.

Another series of experiments were performed using the recipe of TABLE 1 but with two different Xe flows, 15 and 150 sccm.

TABLE 1

|  | Initial Recipe |
|---|---|
| $C_4F_6$ Flow (sccm) | 10 |
| Xe Flow (sccm) | 15–150 |
| Inner Source Power (W) | 300 |
| Outer Source Power (W) | 1250 |
| Bias Power (W) | 1400 |
| Pressure (mTorr) | 7 |
| Roof Temp. (° C.) | 200 |
| Ring Temp. (° C.) | 270 |
| Cathode Temp. (° C.) | +10 |
| Backside He Pressure (Torr) | 7 |

In one set of experiments, the process etches a hole through 0.8 μm of oxide. An overlying photoresist layer is patterned with a 0.5 μm hole, and the oxide is underlaid with a nitride layer. At 15 sccm of Xe, the hole profile angle is about 88°, and a slight loss of nitride is observed. At 150 sccm of Xe, the hole profile angle decreases to 86°, but no nitride loss is visible. In another set of experiment, the SAC structure is etched with a bottom hole width of 0.36 μm and a side gap of 0.18 μm beside the gate structure. Although the corner nitride selectivity is acceptable at the lower Xe flow, corner nitride etching virtually disappears at the higher Xe flow. The etching was not carried to completion of the via hole. However, no polymer residue is observed in the narrow side gap. A related experiment was performed on a structure having a gap of 0.13 μm between the gate structures, the gate structures having a height as measured by the nitride of about 0.45 μm. The recipe follows that of TABLE 1 with a $C_4F6$ flow of 20 sccm and a Xe flow of 15 sccm. Substantial but acceptable nitride corner faceting is observed. Importantly, no etch step is observed through the completion of the narrow hole etching.

The etch rates observed with the recipe of TABLE 1 are considered to be somewhat low for commercial applications. Accordingly, the recipe was modified to that presented in TABLE 2, which has a higher pressure of 45 milliTorr as well as somewhat higher powers and $C_4F6$ flow, all intended to increase the etch rate.

TABLE 2

|  | Baseline SAC Recipe |
|---|---|
| $C_4F_6$ Flow (sccm) | 16 |
| Xe Flow (sccm) | 350 |
| Inner Source Power (W) | 360 |
| Outer Source Power (W) | 1600 |
| Bias Power (W) | 1800 |
| Pressure (mTorr) | 45 |
| Roof Temp. (° C.) | 180 |
| Ring Temp. (° C.) | 270 |
| Cathode Temp. (° C.) | +10 |
| Backside He Pressure (Torr) | 7 |

As measured in a 0.4 µm-wide, 1.2 µm-deep hole, the oxide etch rate is 600 nm/min. The profile angle is approximately 89°, but there is some barreling over 1.8 µm. When a SAC structure is used, in a narrow side gap beside the gate structure, some tapering is manifested as a bottom corner oxide. The nitride corner selectivity is too high to measure.

A $C_4F_6$ process flow window was established in a SAC structure for a lower bias power of 1400W. At 10 sccm of $C_4F_6$, the oxide etch rate is slow, but the nitride corner selectivity is very good. At 12 sccm, the etch rate has improved, and this would probably represent the best $C_4F_6$ flow. At 14 sccm, a little oxide bottom corner tapering is observed. At 16 sccm, etch stop in the small side gap is beginning but is not severe. However, at 20 sccm, the etch stop is complete at about half way down the small side gap. Thus, a total flow window of about 4 sccm is observed at at $C_4F_6$ flow of 12 sccm, that is, a total process window of about 33% around and with respect to the central value within the window. The flow window should translate to the slightly different conditions of TABLE 2.

The effects of varying bias power and source power were investigate using the baseline recipe of TABLE 2. In all cases, a bias power of 1800W produces a good profile and no etch stop, while 1400W of bias power produces either full or partial etch stop. Surprisingly, the etch stop behavior is somewhat ameliorated at lower source powers of 330W and 1370W for the inner and outer source powers. Further decreases to 300/1250W, 240/1000W, and 210/875W show in the case of 1400W bias power a slight decrease in profile angle and no etch stop. In all cases in the power variations, the nitride corner selectivity is very good. These results show that a minimum bias power of at least 1600W for a 200 mm wafer (5.1W/cm$^2$) is desirable, at least for the recipe tested. Reduced source power may improve etch stop.

A two-dimensional window study was performed by varying the pressure to 35 and 55 milliTorr and the xenon flow to 250 and 450 sccm. The conditions were generally those of the baseline recipe of TABLE 2, but with a $C_4F_6$ flow of 12 sccm and 1400W of bias power. Better profiles are obtained at the lower Xe flow; better nitride corner selectivity is obtained at the higher Xe flow. The variations with pressure are less pronounced. Other studies show that the oxide etch rate increases somewhat with pressure, and in deep trenches more barreling is observed in the profile.

It has been found that the etch rate can be increased by lowering the pedestal temperature from +10° C. to −10° C., but the profile angle is decreased somewhat. In neither case is corner loss a problem.

Another application benefitting from the use of hexafluorobutadiene is a timed counterbore etch process for a dual-damascene structure. In the dual-damascene structure, narrow via (or contact) holes are formed at the bottom of the oxide layer, and a larger trench is formed at the top of the oxide layer over several of the via holes. Both the trench and the via holes are filled in a single metal deposition step without any masking, but the metal filling may have several substeps, for example, barrier layers, conformal deposited seed layers, and a subsequent fill by electroplating. Chemical mechanical polishing (CMP) then removes any metal on the top of the oxide outside of the trenches, thus defining the horizontal interconnects in the trenches.

Figure 1:
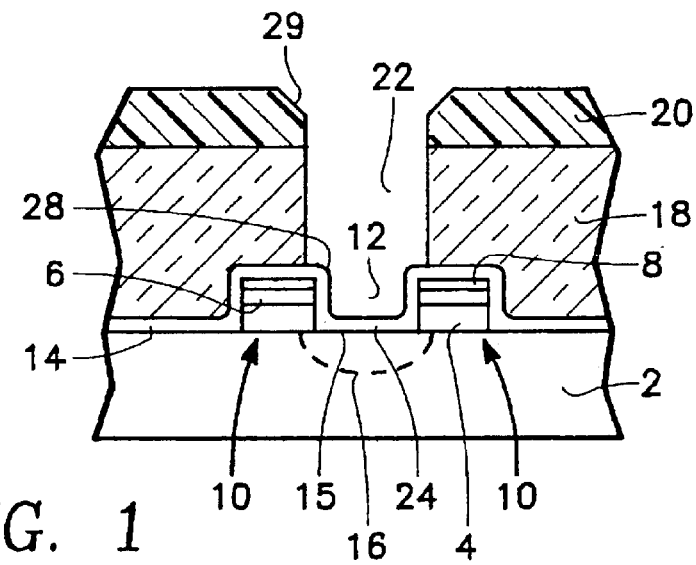
FIG. 1 is a cross-section view of a self-aligned contact (SAC) structure.
Figure 2:
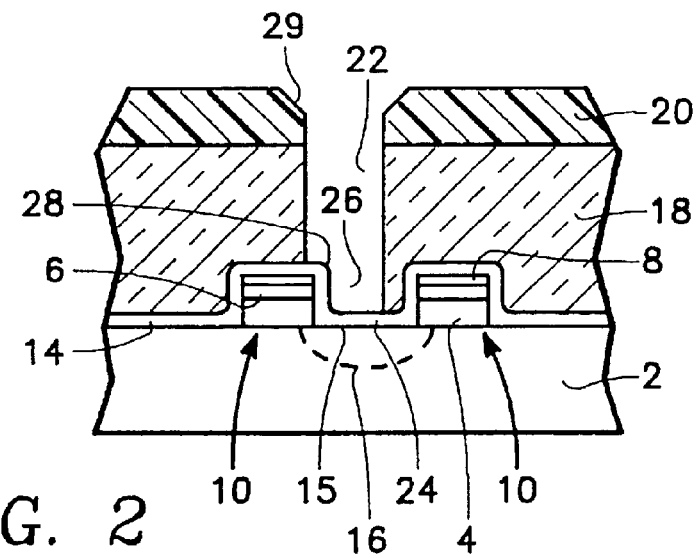
FIG. 2 illustrates a variant of the structure of FIG. 1
Figure 4:
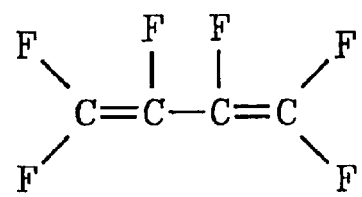
FIG. 4 illustrates the chemical structure of hexafluorobutadiene.
Figure 3:
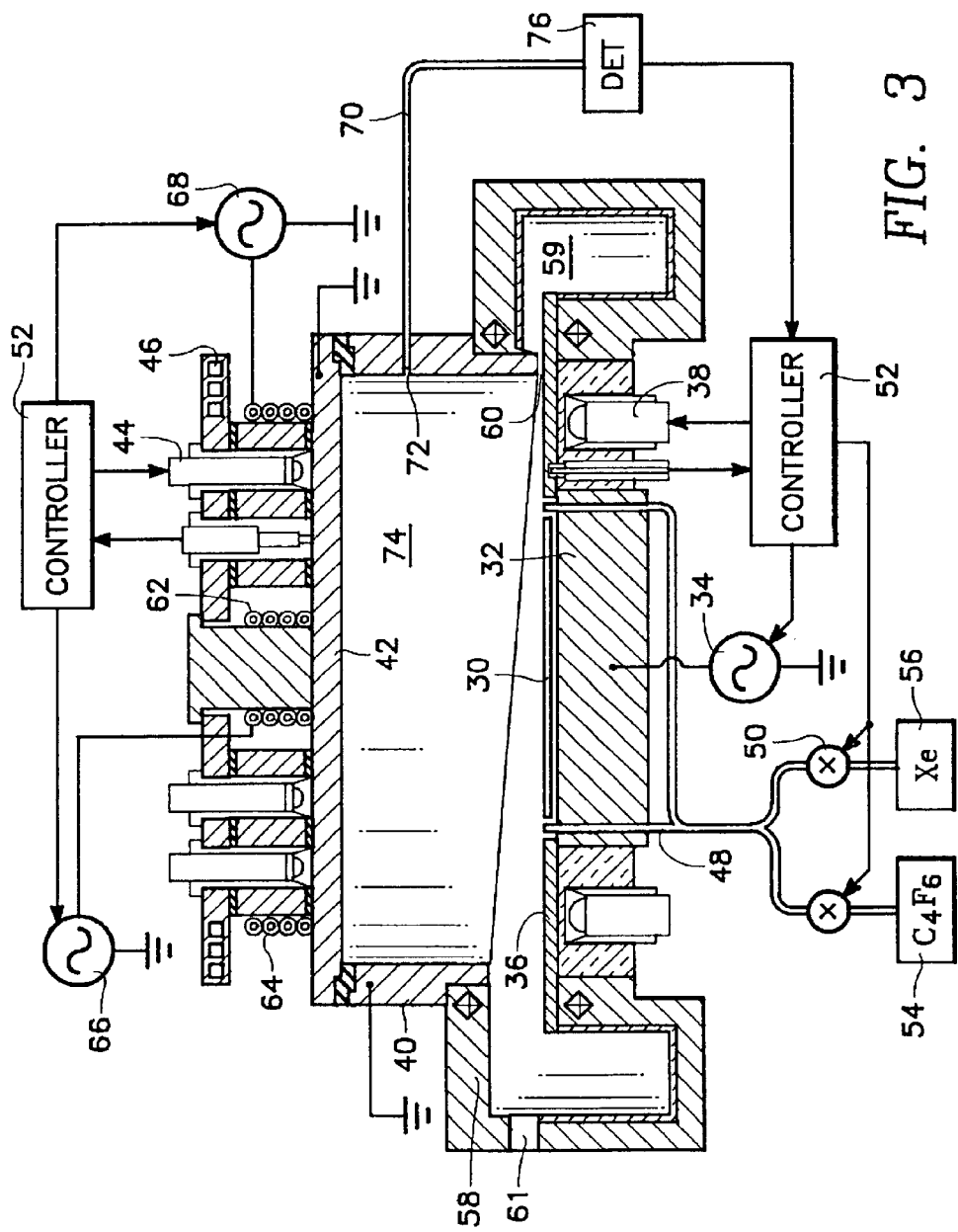
FIG. 3 is a schematic view, partly in cross section, of an inductively coupled high-plasma density etch reactor.
Figure 9:
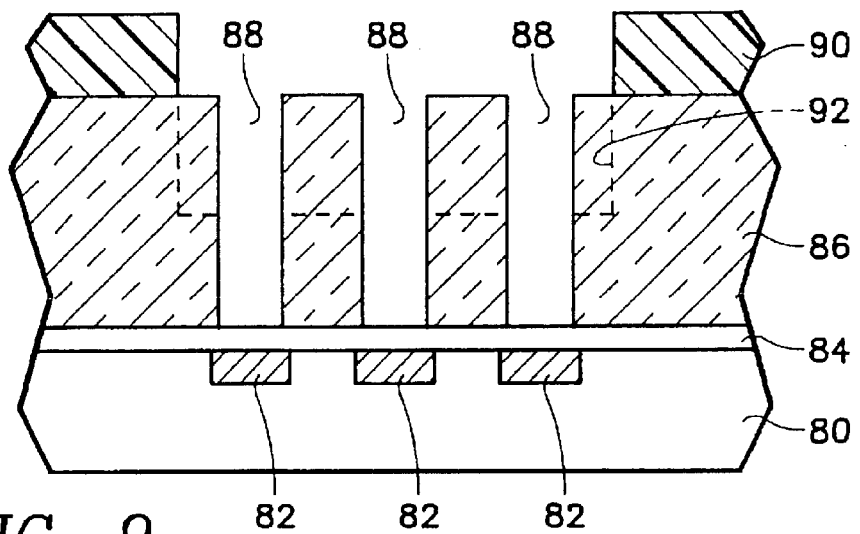
FIG. 9 is a cross-sectional view of an idealized dual-damascene structure formed by a timed counterbore etch.

The counterbore version of dual-damascene first defines extended via holes in the oxide and thereafter defines the trench to extend only part way through the oxide. As illustrated in the cross-sectional view of FIG. 9, a substrate 80 is formed with several conductive features 82 in its top surface. These may be projecting gate structures such as those in FIG. 1 or lower-level wiring features that cannot be directly connected because of intervening features. A silicon nitride stop layer 84 is deposited over the substrate 80 and its conductive features 82, and an oxide layer 86 is deposited over the stop layer 84. Extended via (or contact) holes 88 are etched through the oxide layer to the portions of the nitride stop layer overlying the conductive features 82, it being understood that there are probably additional conductive features between those illustrated. The deep via etch must stop on nitride and not produce etch stop. However, this etch is not overly demanding because no nitride corners are exposed so that only planar nitride selectivity is required.

After the completion of the counterbore deep via etch, the via mask is removed, and a photoresist layer 90 is deposited over the top of the oxide 86 and patterned according to the intended trench. In the timed counterbore process, the trench etch is timed to extend approximately half-way through the oxide layer 86 to form an idealized trench 92, indicated by dotted lines in FIG. 9. During the timed counterbore trench etch using a non-oxide selective etch chemistry, the underlying nitride stop layer 84 prevents further etching of the underlying material. As noted before, a subsequent single metal filling sequence fills both the bottom portions of the vias 88 and the trench 92 after whatever nitride 84 remains at the bottom of the vias is removed by a post-etch.

Unlike the more conventional counterbore etch, the timed counterbore trench etch does not rely upon another nitride stop layer formed between upper and lower portions of the oxide layer 86 to define the bottom of the trench 92 since the fluorocarbon etch can be made highly selective to nitride. Thus, the timed counterbore potentially simplifies both the deposition and the etching procedures in forming a dual-damascene structure. However, the timed counterbore process has not been found to be very successful in the past because of severe faceting of the oxide corners surrounding the via holes. Faceting is exhibited in silicon oxide by approximately 45° facets at the corner caused by the unfavorable geometry of an exposed 90° oxide corner during an oxide etch.

A certain degree of faceting is acceptable. As illustrated in the cross-sectional view of FIG. 10, facets 96 are formed both in the narrow horizontal oxide wall 98 and also at the intended side shelf 100, shown by dotted lines, of the idealized trench 92. The facets 96 however still leave vias 102 with substantial inter-via side walls 104 sufficient to isolate one via from another. A rough rule of thumb is that the via side wall 104 should be as tall as the width of the oxide 98 between two immediately adjacent vias 102 since there may be other conductive features on the same spacings that are not intended to be contacted. The resulting trench 106 is similarly isolated from portions of the substrate 80 not immediately adjacent the conductive features 82, which are being contacted anyway.

However, excessive faceting can degrade the critical dimension (CD) of the via and perhaps cause immediate shorting. As illustrated in the cross-sectional view of FIG. 11, severe faceting produces low ridges 110 and sloping sidewalls 112, 114 perhaps extending down to the nitride stop layer 84. The bottom CD is lost both at the inter-via wall and the side of the trench, which corresponds to the isolation afforded to conductive features not being contacted. The resulting trench 116 is overly deep and insufficiently isolated from areas of the substrate 80 not intended to be contacted.

A $C_4F_6$/Xe recipe summarized in TABLE 3 has been developed in the IPS chamber for the timed trench etch in the counterbore dual-damascene process.

TABLE 3

|  | Timed Trench Recipe |
| --- | --- |
| $C_4F_6$ Flow (sccm) | 15 |
| Xe Flow (sccm) | 15 |
| Inner Source Power (W) | 300 |
| Outer Source Power (W) | 1500 |
| Bias Power (W) | 1000 |
| Pressure (mTorr) | 7 |
| Roof Temp. (° C.) | 200 |
| Ring Temp. (° C.) | 270 |
| Cathode Temp. (° C.) | +10 |
| Backside He Pressure (Torr) | 10 |

Figure 10:
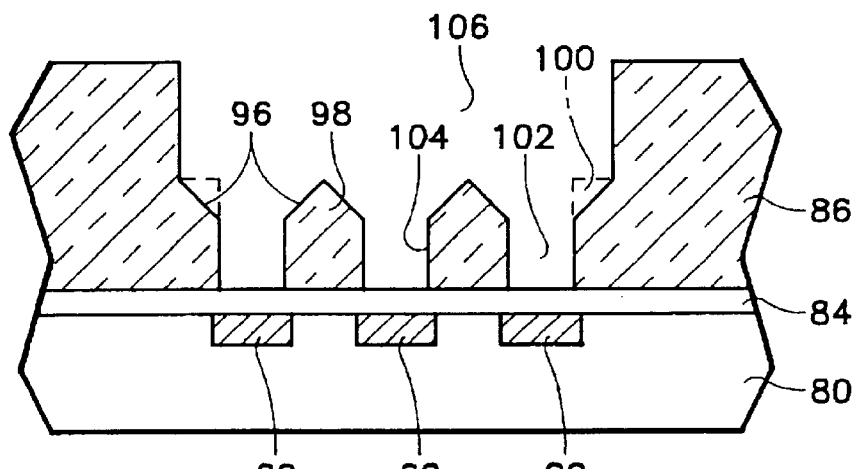
FIG. 10 is a cross-sectional view of a realistic but acceptable dual-damascene structure by a timed counterbore etch.

This recipes produces a structure similar to that illustrated in FIG. 10. The taper angle for the via is about 86½°. A similar recipe using $C_4F_8$/Ar produces significantly greater tapering and reduced sidewall height.

Figure 11:
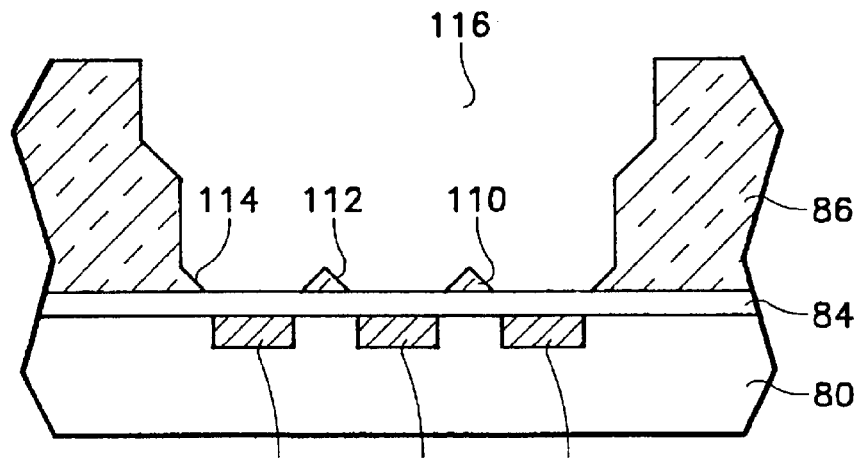
FIG. 11 is a cross-section view of a unacceptable dual-damascene structure formed by a timed counterbore etch.

Greater amounts of xenon can used. However, at 150 sccm of Xe, the height of the via sidewall is reduced. On the other hand, substantially less Xe produces very poor results. With no xenon, the unacceptable structure of FIG. 11 is produced. Furthermore, polymer forms both on the trench shelf, which is not bad, but also on the bottom of the via hole, indicating etch stop.

Thus, with a process such as the timed counterbore etch in which oxide faceting is more of a problem than nitride selectivity, a $C_4F_6$/Xe recipe with at least as much Xe as $C_4F_6$ is effective.

It is noted that these results were obtained without the use of a conformal BARC layer deposited prior to the trench lithography. Although the BARC layer is primarily intended to intended to serve as an anti-reflection coating, it is sometimes useful for additional sidewall anisotropy in the holes preformed in the oxide layer.

Although hexafluorobutadiene is the preferred fluorocarbon for use with the invention, similar heavy fluorocarbons such as hexafluorocyclobutene (c-$C_4F_6$), hexafluorobenzene ($C_6F_6$), and octafluoropentadiene ($C_5F_8$) are expected to provide very similar etching results even if at least the first two are more difficult to handle. These all have long carbon chains of at least four carbons and favorably low F/C ratios, although the F/C ratio of $C_4F_8$ is not as favorable as the others. The listed fluorocarbons contain no hydrogen, but one or perhaps two carbons in a heavy fluorocarbon should not significantly change its oxide etching properties.

Preliminary experiments have shown that a high xenon flow rate aids the selectivity of $C_4F_8$ over nitride and provides a reasonable process window. Yet other hydrogen-free and hydrogen-containing fluorocarbons may also be used in conjunction with a high flow rate of xenon. Xenon is also expected to produce beneficial results when used as the diluent in combination with other fluorine-based active etching gases, such as $SF_6$. Carbon monoxide is a conventional additive to increase selectivity and the profile angle. It may be added to the fluorocarbon/xenon mixture, but it is not believed necessary, especially in view of its difficulty in handling. Generally, the advantages can be obtained with an etching gas consisting of a fluorine-based gas and xenon and possibly another noble gas, without the addition of other elements, such as CO, $O_2$, $N_2$, or other gases.

It is possible to gain some of the advantages of the inventions using krypton (Kr) as the carrier gas since krypton is a noble gas heavier than the typical argon. However, krypton is not only expensive, xenon is heavier than it. It is also possible to tune the chemistry with a mixture of various noble gases. However, in the work performed to date with the SAC structures, a mixture of Ar and Xe does not seem to provide any advantage.

Although the invention is particularly useful for SAC structures and counterbore dual-damascene structures, there are other structures requiring high selectivity to nitride, for example, a nitride hard mask or a nitride stop layer in a damascene structure. Furthermore, the invention is also applicable to other non-oxide layer underlying an oxide layer. The non-oxide material may be, for example, silicon, polysilicon, or metals. The oxide material may include other materials containing at least 50 atomic % of oxygen, such as some low-k dielectric materials based on either silicon or carbon.

Although the invention has been explained in use with a high-density plasma reactor using inductive coupling, other high-density plasma reactors, such as remote plasma source (RPS) and electron-cyclotron resonance (ECR) similar generate a high-density plasma remote from the pedestal electrode and the bias-controlled sheath. Furthermore, many advantages of the invention may be achieved with a low-density plasma reactor, such as the conventional capacitively coupled reactor. The $C_4F_6$ patent application shows beneficial results in a capacitively coupled magnetically enhanced reactive ion etcher (MERIE).

The invention thus provides advantageous results in oxide etching with commonly available fluorocarbons and xenon and using common operating parameters.

What is claimed is:

1. A process for etching an oxide layer in the presence of a nitride layer, wherein said oxide layer is preformed with holes extending downwardly from a top surface thereof and corners of said oxide layer at tops of said holes are exposed during the process, said process comprising the steps of:
    flowing into a plasma reaction chamber a gas mixture comprising a first amount of hexafluorobutadiene and a second amount of xenon and including substantially no carbon monoxide, wherein a ratio of said second amount to said first amount is at least one;
    applying a first level of RF power to a pedestal electrode supporting a substrate containing said oxide and nitride layers; and
    exciting said gas mixture into a plasma to thereby selectively etch said oxide layer to said nitride layer.

2. The process of claim 1, wherein said oxide layer overlies said nitride layer and said ratio is at least ten, to thereby etch said oxide layer selectively to said nitride layer.

3. The process of claim 1, wherein said exciting step includes applying an oscillatory electrical signal to excite said gas mixture into a plasma in a region remote from said pedestal electrode.

4. The process of claim 3, wherein said oscillatory electrical signal is coupled to an inductive coil adjacent to said chamber.

5. The process of claim 3, wherein said applying steps applies at least 1600W to said pedestal electrode normalized to a 200 mm wafer.

6. The process of claim 1, wherein processing conditions are chosen to produce a processing window of 25% in the amount of the hexafluorobutadiene.

7. A process for etching an oxide layer preformed with first holes extending downwardly from a top surface thereof, comprising the steps of:
　flowing into a plasma reaction chamber a gas mixture comprising a first amount of a fluorine-containing gas and a second amount of a chemically inactive diluent gas, wherein a ratio of said second amount to said first amount is at least one;
　applying a first level of RF power to a pedestal electrode supporting a substrate containing said oxide layer; and
　exciting said gas mixture into a plasma to etch said oxide layer, wherein corners of said oxide layer at tops of said first holes are exposed during the process and wherein said exciting step etches said oxide layer for only a predetermined length of time to etch only partially through said oxide layer from said top surface.

8. The process of claim 7 carried out in the presence of a nitride layer, wherein said plasma etches said oxide layer selectively to said nitride layer.

9. The process of claim 8, wherein said oxide layer overlies said nitride layer.

10. The process of claim 7, wherein said fluorine-containing gas comprises a fluorocarbon.

11. The process of claim 10, wherein said fluorocarbon consists of at least four carbon atoms, at least an equal number of fluorine atoms, and no more than two hydrogen atoms.

12. The process of claim 10, wherein said fluorocarbon is hydrogen free.

13. The process of claim 11, wherein said fluorocarbon is selected from the group consisting of $C_4F6$, $C_5F_8$, and $C_6F_6$.

14. The process of claim 13, wherein said fluorocarbon comprises hexafluorobutadiene.

15. The process of claim 14, wherein said oxide layer overlies a nitride layer and said plasma etches said oxide layer selectively to said nitride layer.

16. The process of claim 7, wherein said chemically inactive diluent gas is xenon.

17. The process of claim 7, wherein said chemically inactive diluent gas is argon.

18. The process of claim 7, wherein said oxide layer is precoated with an etching mask having an aperture larger than and surrounding at least one of said first holes.

19. The process of claim 7,
　wherein said exciting step etches second holes in said oxide layer, and
　wherein said first holes form via holes and said second holes form trenches in a dual damascene interconnect system.

20. A process for etching an oxide layer preformed with first holes extending downwardly from a top surface thereof, comprising the steps of:
　flowing into a plasma reaction chamber a gas mixture comprising a first amount of $C_5F_8$ and a second amount of a chemically inactive diluent gas, wherein a ratio of said second amount to said first amount is at least one;
　applying a first level of RF power to a pedestal electrode supporting a substrate containing said oxide layer; and
　exciting said gas mixture into a plasma to etch said oxide layer, wherein corners of said oxide layer at tops of said first holes are exposed during the process and wherein said exciting step etches said oxide layer for only a predetermined length of time to etch only partially through said oxide layer from said top surface.

21. A dual damascene process for etching an oxide layer preformed with first holes extending downwardly from a top surface thereof and covered by a mask layer including a second hole therethrough larger than and surrounding at least one of said first holes, comprising the steps of:
　flowing into a plasma reaction chamber a gas mixture comprising (a) a fluorocarbon selected from the group consisting of $C_4F6$, $C_5F_8$, and $C_6F_6$ and (b) a chemically inactive diluent gas; and
　applying RF power to a pedestal electrode supporting a substrate containing said oxide layer and exciting said gas mixture into a plasma to etch said oxide layer, wherein corners of said oxide layer at tops of said first holes are exposed during the process.

22. The process of claim 21, wherein a portion of a top surface of said oxide layer is exposed by said second hole.

23. The process of claim 21, wherein a nitride layer is disposed below said oxide layer and is exposed by said first holes.

24. The process of claim 23, wherein no other nitride layer is disposed between a top surface of said oxide layer and said nitride layer.

25. The process of claim 21, wherein said fluorocarbon comprises hexafluorobutadiene.

26. The process of claim 21, wherein a separate source of oscillatory electrical power excites said gas mixture to said plasma.

27. The process of claim 21, wherein said RF power applied to said pedestal electrode excites said gas mixture to said plasma, no other effective source of oscillatory electrical power being applied to said plasma reaction chamber.

28. The process of claim 21, wherein said applying and exciting step is terminated before portions of said oxide layer exposed by said second hole are etched through.

29. A dual damascene process for etching an oxide layer preformed with first holes extending downwardly from a top surface thereof and covered by a mask layer including a second hole therethrough larger than and surrounding at least one of said first holes, comprising the steps of:
　flowing into a plasma reaction chamber a gas mixture comprising (a) $C_5F_8$ and (b) a chemically inactive diluent gas; and
　applying RF power to a pedestal electrode supporting a substrate containing said oxide layer and exciting said gas mixture into a plasma to etch said oxide layer, wherein corners of said oxide layer at tops of said first holes are exposed during the process.

* * * * *